United States Patent
Pan et al.

(10) Patent No.: US 8,415,702 B2
(45) Date of Patent: Apr. 9, 2013

(54) REFLECTOR, MANUFACTURE METHOD THEREOF AND LIGHT-EMITTING DEVICE INCLUDING THE REFLECTOR

(75) Inventors: Qunfeng Pan, Xiamen (CN); Jyh-Chiarng Wu, Xiamen (CN); Kechuang Lin, Xiamen (CN)

(73) Assignee: Xiamen Sanan Optoelectronics Technology Co., Ltd., Xiamen, Fujian (CN)

( * ) Notice: Subject to any disclaimer, the term of this patent is extended or adjusted under 35 U.S.C. 154(b) by 0 days.

(21) Appl. No.: 13/233,367

(22) Filed: Sep. 15, 2011

(65) Prior Publication Data
US 2012/0104410 A1    May 3, 2012

(30) Foreign Application Priority Data
Oct. 29, 2010  (CN) .......................... 2010 1 0523518

(51) Int. Cl.
*H01L 33/00* (2010.01)

(52) U.S. Cl. .......... 257/98; 257/E33.055; 257/E33.063; 438/29

(58) Field of Classification Search .............. 257/12, 257/72, 79–103; 438/29
See application file for complete search history.

(56) References Cited

U.S. PATENT DOCUMENTS

| | | | |
|---|---|---|---|
| 6,847,057 B1 * | 1/2005 | Gardner et al. | 257/99 |
| 7,223,998 B2 * | 5/2007 | Schwach et al. | 257/86 |
| 7,420,218 B2 * | 9/2008 | Nagai | 257/98 |
| 7,928,448 B2 * | 4/2011 | Wierer et al. | 257/79 |
| 8,119,534 B2 * | 2/2012 | Tanaka et al. | 438/734 |
| 2008/0042153 A1 * | 2/2008 | Beeson et al. | 257/94 |
| 2010/0032701 A1 * | 2/2010 | Fudeta | 257/98 |
| 2010/0133529 A1 * | 6/2010 | Taraschi et al. | 257/43 |
| 2010/0135349 A1 * | 6/2010 | Schowalter et al. | 372/45.012 |
| 2010/0264454 A1 * | 10/2010 | Yi et al. | 257/99 |
| 2012/0086028 A1 * | 4/2012 | Beeson et al. | 257/98 |
| 2012/0104440 A1 * | 5/2012 | Peng et al. | 257/98 |

\* cited by examiner

*Primary Examiner* — Julio J Maldonado
*Assistant Examiner* — Cory Eskridge
(74) *Attorney, Agent, or Firm* — Boyle Fredrickson, S.C.

(57) ABSTRACT

A reflector for a GaN-based light-emitting device, method for manufacturing the reflector and GaN-based light-emitting device including the reflector are provided. The reflector is formed on a p-type GaN-based epitaxial layer and includes: a whisker crystal of un-doped GaN, formed on a surface of the p-type GaN-based epitaxial layer with a predefined density distribution and at a position that corresponds to a dislocation defect of an epitaxial layer; and a metal reflective layer, formed on both the p-type GaN-based epitaxial layer and the whisker crystal. The whisker of un-doped GaN is positioned on the dislocation defect of the p-type GaN-based epitaxial layer, so that the Ag reflective layer can be separated from the dislocation defect of the p-type GaN-based epitaxial layer, thereby effectively preventing Ag from moving inside the dislocation defect via electromigration, and largely decreasing the possibility of current leakage of the light-emitting device including the Ag reflector.

4 Claims, 3 Drawing Sheets

REFLECTOR, MANUFACTURE METHOD THEREOF AND LIGHT-EMITTING DEVICE INCLUDING THE REFLECTOR

CROSS REFERENCE TO RELATED APPLICATIONS

This application claims the benefit of Chinese patent application 201010523518.5 filed Oct. 29, 2010 hereby incorporated by reference.

FIELD OF THE INVENTION

The invention relates to a reflector for a gallium nitride (GaN) based light-emitting device, a method for manufacturing the reflector, and a GaN-based light-emitting device including the reflector.

BACKGROUND OF THE INVENTION

Recently, solid-state lighting, especially that with GaN-based wide band-gap semiconductor material, has been rapidly developed. GaN-based light-emitting devices have been widely used in the fields including display, indication, backlight source and illumination.

In GaN-based light-emitting diodes (LEDs), the epitaxial structure normally includes a p-type epitaxial layer on the top (p-side up), and can be classified as a conventional structure or a flip-chip structure depending on its light-extracting surface. The light-extracting surface of a GaN-based LED with a conventional structure is a p-type layer, and normally includes a transparent conductive layer formed on the surface of the p-type layer for enhancing current and light extraction; the light-extracting surface of a GaN-based LED with a flip-chip structure is an n-type layer, and normally includes a high-reflectivity metal layer formed on the surface of the p-type layer for enhancing current spreading and reflection. Silver (Ag), as the metal having the highest reflectivity in nature, is heavily used in flip-chip LEDs. However, Ag may cause electromigration, and since the GaN-based material is usually grown on a substrate with lattice mismatch and thermal expansion coefficient mismatch, which has a high density of dislocation defects in its crystal, the electromigration of Ag may extend to the active layer through the dislocation defects, resulting current leakage or short circuit in the LED.

SUMMARY OF THE INVENTION

An object of the present invention is to resolve the technical defect in existing LEDs including an Ag-reflector.

The present invention provides a reflector structure, which can reduce the electromigration of metal Ag and prevent current leakage, and a method for manufacturing the reflector, and provides a GaN-based light-emitting device including the reflector.

According to an aspect of the present invention, a reflector for a GaN-based light-emitting device is provided, which is formed on a p-type GaN-based epitaxial layer and includes:
 a whisker crystal of un-doped GaN, formed on a surface of the p-type GaN-based epitaxial layer with a predefined density distribution and at a position that corresponds to a dislocation defect of an epitaxial layer, wherein the epitaxial layer comprises the p-type GaN-based epitaxial layer; and
 a metal reflective layer, formed on both the p-type GaN-based epitaxial layer and the whisker crystal.

The metal reflective layer may include Ag, an Ag alloy, or a combination thereof.

According to another aspect of the present invention, a method for manufacturing a reflector for a GaN-based light-emitting device is provided, including the steps of:
 1) forming a light-emitting epitaxial layer on a substrate, the light-emitting epitaxial layer including a p-type GaN-based epitaxial layer on its surface;
 2) forming a un-doped GaN epitaxial layer on the p-type GaN-based epitaxial layer;
 3) etching the un-doped GaN epitaxial layer by electrochemical etching, which stops at a surface of the p-type GaN-based epitaxial layer, such that a whisker topography is formed on the un-doped GaN epitaxial layer, and part of the p-type GaN-based epitaxial layer is exposed;
 4) forming a metal reflective layer on both the p-type GaN-based epitaxial layer and the whisker.

In step 2), the un-doped GaN epitaxial layer may have a carrier concentration less than $10^{17}$ cm$^{-3}$; in step 3), the electrochemical etching may be performed under ultraviolet (UV) radiation with an alkaline etchant; and in step 4), the metal reflective layer may include Ag, an Ag alloy, or a combination thereof.

According to another aspect of the present invention, a GaN-based light-emitting device is provided, which includes: an epitaxial structure including an n-type GaN-based epitaxial layer, an active layer and a p-type GaN-based epitaxial layer; and a p-type reflector at the side of the p-type GaN-based epitaxial layer, wherein the p-type reflector includes:
 a whisker crystal of un-doped GaN, formed on a surface of the p-type GaN-based epitaxial layer with a predefined density distribution and at a position that corresponds to a dislocation defect of the epitaxial structure; and
 a metal reflective layer, formed on both the p-type GaN-based epitaxial layer and the whisker crystal.

The metal reflective layer may include Ag, an Ag alloy, or a combination thereof.

The advantages of the present invention include: by forming a p-type reflector on the p-type GaN-based epitaxial layer such that the whiskers of the reflector are positioned on the dislocation defects of the p-type GaN-based epitaxial layer, the Ag reflective layer can be separated from the dislocation defects of the p-type GaN-based epitaxial layer, thereby effectively preventing Ag from moving inside the dislocation defects via electromigration, and largely decreasing the possibility of current leakage of the light-emitting device including an Ag reflector. In addition, since the distribution density of the whiskers corresponds to the dislocations of the epitaxial layer and the area taken by the whiskers is small, the ohmic contact formed between the Ag reflective layer and the p-type GaN-based epitaxial layer remains unaffected.

Figure 1:
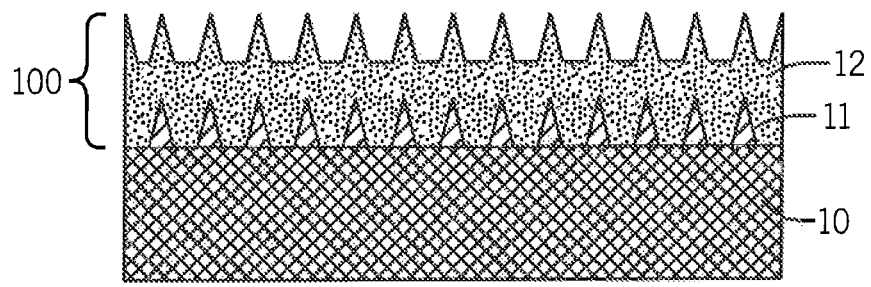
FIG. 1 is a cross-sectional view of a reflector for a GaN-based light-emitting device according to a preferred embodiment of the present invention.

Reference numerals in the figures are listed below:
10: p-GaN layer
11: whisker u-GaN
12: Ag reflective layer
100: reflector
21: sapphire substrate
22: n-GaN layer
23: multiple quantum well (MQW)
24: p-GaN layer
25: u-GaN layer
25*: whisker u-GaN
26: Ag reflective layer
200: reflector
300: p-type reflector
310: sapphire substrate
301: n-GaN layer
302: multiple quantum well (MQW)
303: p-GaN layer
304: whisker u-GaN
305: Ag reflective layer
306: multi metal layer
307: n-type electrode
320: silicon substrate
321: p-type solder joint
322: n-type solder joint
400: p-type reflector
401: n-GaN layer
402: multiple quantum well (MQW)
403: p-GaN layer
404: whisker u-GaN
405: Ag reflective layer
406: multi metal layer
410: silicon substrate
411: p-type electrode
412: n-type electrode

DETAILED DESCRIPTION OF THE INVENTION

The present invention is described in details hereinafter in conjunction with FIG. 1 to FIG. 6 and preferred embodiments.

FIG. 1 is a cross-sectional view of a reflector for a GaN-based light-emitting device according to a preferred embodiment of the invention.

A reflector 100 is formed on a p-type GaN-based epitaxial layer 10. The reflector 100 includes two components: whiskers 11 of u-GaN, formed on the p-type GaN-based epitaxial layer 10, particularly, on the surface of the p-type GaN-based epitaxial layer 10 with a predefined density distribution and at positions that correspond to the dislocation defects of an epitaxial layer; and an Ag reflective layer 12, formed on both the p-type GaN-based epitaxial layer 10 and the whiskers 11.

In this embodiment, the whiskers 11 of the reflector 100 are positioned on the dislocation defects of the p-type GaN-based epitaxial layer 10, so that the Ag reflective layer 12 can be separated from the dislocation defects of the p-type GaN-based epitaxial layer 10, thereby effectively preventing Ag from moving inside the dislocation defects via electromigration, and largely decreasing the possibility of current leakage of the light-emitting device including an Ag reflector. In addition, since the distribution density of the whiskers 11 corresponds to the dislocations of the epitaxial layer and the area taken by the whiskers is small, the ohmic contact formed between the Ag reflective layer 12 and the p-type GaN-based epitaxial layer 10 remains unaffected.

Figure 2:
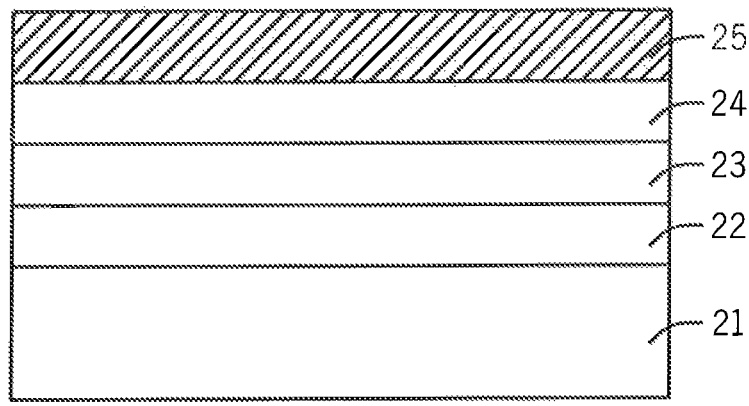
FIG. 2 to FIG. 4 illustrate a process for manufacturing a reflector for a GaN-based light-emitting device according to a preferred embodiment of the present invention.
Figure 3:
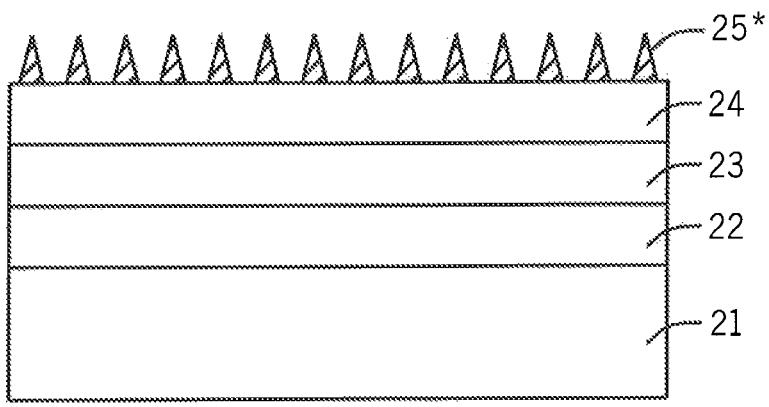
Figure 4:
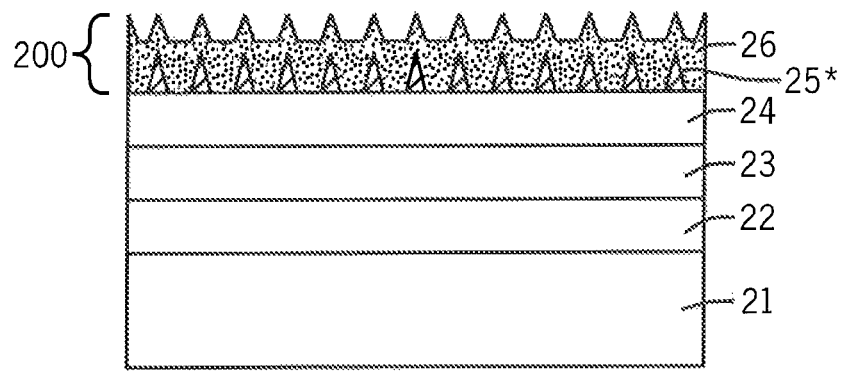

FIG. 2 to FIG. 4 illustrate a process for manufacturing a reflector for a GaN-based light-emitting device according to a preferred embodiment of the present invention.

As shown in FIG. 2, an n-GaN layer 22, a multiple quantum well (MQW) layer 23, a p-GaN layer 24 and a u-GaN layer 25 are grown on a sapphire substrate 21 in that order by Metal-organic Chemical Vapor Deposition (MOCVD), and the electron concentration of the u-GaN layer 25 is less than $10^{17} cm^{-3}$.

As shown in FIG. 3, the u-GaN layer 25 is processed by electrochemical etching, the conditions of which include: radiation on the surface of the light-emitting epitaxial layer at a power density of 50 mW/cm² provided by a mercury lamp with a radiation rage of 280 nm-350 nm; the etchant being a 0.05 mol/L KOH solution; and under room temperature. The etching duration is 120 minutes. Finally, whiskers u-GaN 25* with a predefined density are formed, the other regions of the u-GaN layer 25 are removed completely by etching, and the etching stops at the p-GaN layer 24, so that the p-GaN layer 24 at those regions are exposed.

As shown in FIG. 4, an Ag reflective layer 26 with a thickness of 250 nm is formed by electron beam evaporation. The Ag reflective layer 26 uniformly covers the whiskers 25* and the exposed p-GaN layer 24, and an ohmic contact is formed between the Ag reflective layer 26 and the p-GaN layer 24. The whiskers 25* and the Ag reflective layer 26 form a reflector 200.

By processing the u-GaN layer 25 with electrochemical etching, in one aspect, the u-GaN layer 25 can be etched to form a whisker topography; in another aspect, the electrochemical etching can not etch the p-GaN layer 24 in absence of a bias voltage, hence the etching stops at the p-GaN layer 24 and the p-GaN layer is exposed, which is beneficial for subsequent formation of the ohmic contact with the Ag reflective layer 26. The mechanism behind the formation of the whiskers is: the electrochemical etching under the ultraviolet radiation starts from those regions of the expitaxial layer that have a good crystal quality with no defects, but the etching is suppressed around defects because they cause free holes to disappear. Hence, the epitaxial layer is not uniformly etched. The regions having a good crystal quality are eroded and then completely etched. But because of the dislocation defects with a predefined density in the GaN epitaxial layer, which may act as effective non-radiative recombination centers and absorb holes, the etch rate around the dislocation defects in the epitaxial layer is not as fast as the etch rate in the epitaxial layer where there are no defects. As a result, the whiskers can remain after a long period of etching while having a density directly related to the density of the dislocations and positions that correspond to the dislocations.

Figure 5:
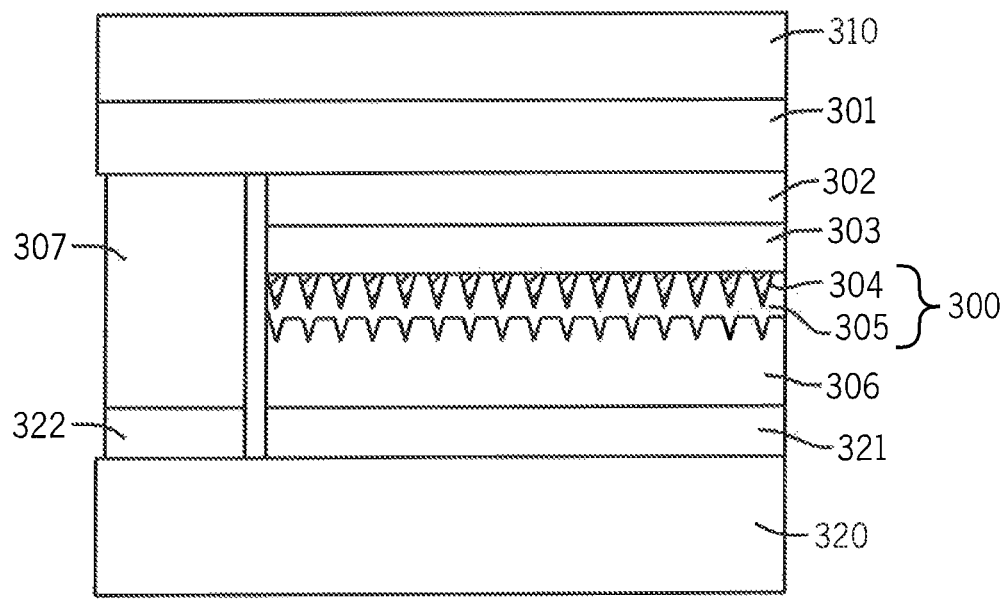
FIG. 5 is a cross-sectional view of a GaN-based light-emitting device including a reflector shown in FIG. 1 according to an embodiment of the present invention.

FIG. 5 is a cross-sectional view of a GaN-based light-emitting device including a reflector shown in FIG. 1 according to an embodiment of the present invention.

FIG. 5 shows a GaN-based light-emitting device with a flip-chip structure, which generally includes two components: a flip-chip LED chip and a silicon substrate.

The flip-chip LED chip includes: a sapphire substrate 310; an n-GaN layer 301, formed on the sapphire substrate 310; a multiple quantum well layer 302, formed on the n-GaN layer 301; a p-GaN layer 303, formed on the multiple quantum well layer 302; a p-type reflector 300, formed on the p-GaN layer 303, wherein the p-type reflector 300 includes whiskers 304 and an Ag reflective layer 305, the whiskers 304 are formed of u-GaN, and are distributed on the p-GaN layer 303 at positions that correspond to the dislocation defects of the epitaxial layer, and the Ag reflective layer 305 covers both the whiskers 304 and the p-GaN layer 303; a multi-metal layer 306, formed on the Ag reflective layer 305; and, an n-type electrode 307, formed on part of the n-GaN layer 301.

The silicon substrate includes: a silicon substrate 320; and a p-type solder joint 321 and an n-type solder joint 322, formed on the silicon substrate 320, wherein the p-type solder joint 321 and the n-type solder joint 322 are electrically isolated from each other.

The multi-metal layer 306 is connected with the p-type solder joint 321, and the n-type electrode 307 is connected with the n-type solder joint 322, thereby forming the GaN-based LED with a flip-chip structure.

Figure 6:
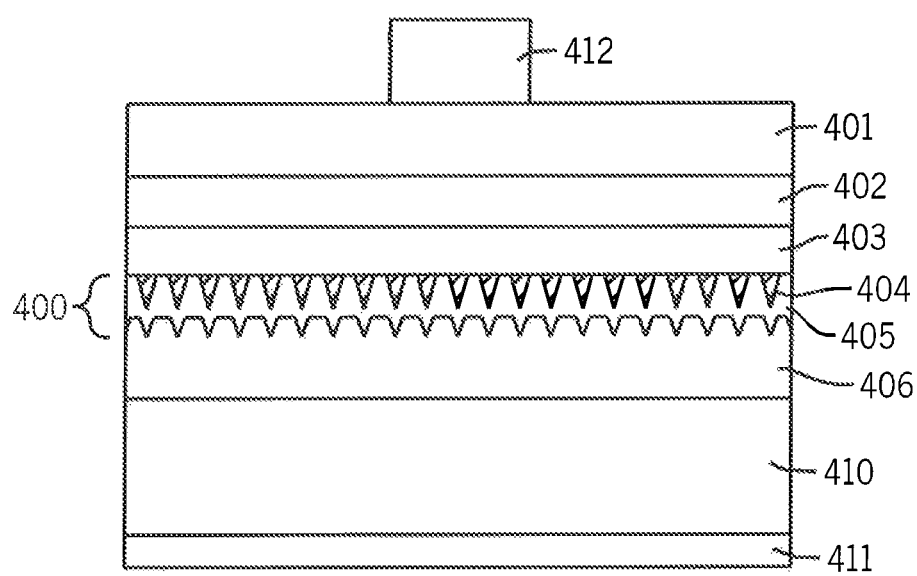
FIG. 6 is a cross-sectional view of a GaN-based light-emitting device including a reflector shown in FIG. 1 according to another embodiment of the present invention.

FIG. 6 is a cross-sectional view of a GaN-based light-emitting device including a reflector shown in FIG. 1 according to another embodiment of the present invention.

As shown in FIG. 6, the GaN-based LED with a vertical structure includes: a silicon substrate 410; a multi-metal layer 406, formed on the silicon substrate 410; a p-type reflector 400, formed on the multi-metal layer 406; a p-GaN layer 403, formed on the p-type reflector 400, wherein the p-type reflector 400 includes whiskers 404 and an Ag reflective layer 405, the whisker 404 are formed of u-GaN, and are distributed on the surface of the p-GaN layer 403 at positions that correspond to the dislocation defects of the epitaxial layer, and the Ag reflective layer 405 covers both the whiskers 404 and the p-GaN layer 403; a multiple quantum well layer 402, formed on the p-GaN layer 403; an n-GaN layer 401, formed on the multiple quantum well layer 402; an n-type electrode 412, formed on the n-GaN layer 401; and a p-type electrode 411, formed on the back of the silicon substrate 410.

The GaN-based LEDs shown in FIG. 5 and FIG. 6 both use the reflector structure shown in FIG. 1 and the manufacturing method shown in FIG. 2 to FIG. 4, thereby effectively preventing Ag electromigration and current leakage, and obtaining a highly reliable light-emitting device.

The embodiments above are for illustrative purposes only and should not be interpreted as limiting the scope of the present invention. Various modifications and variations can be made by those skilled in the art without departing from the scope of the present invention. Therefore, the equivalents should fall with the scope of the present invention, which is defined by the claims attached thereto.

The invention claimed is:

1. A reflector for a GaN-based light-emitting device, wherein the reflector is formed on a p-type GaN-based epitaxial layer and comprises:
   a whisker crystal of un-doped GaN, formed on a surface of the p-type GaN-based epitaxial layer with a predefined density distribution and at a position that corresponds to a dislocation defect of an epitaxial layer wherein the epitaxial layer comprises the p-type GaN-based epitaxial, layer; and
   a metal reflective layer, formed on both the p-type GaN-based epitaxial layer and the whisker crystal.

2. The reflector according to claim 1, wherein the metal reflective layer comprises Ag, an Ag alloy, or a combination thereof.

3. A GaN-based light-emitting device, comprising:
   an epitaxial structure comprising an n-type GaN-based epitaxial layer, an active layer and a p-type GaN-based epitaxial layer; and a p-type reflector at the side of the p-type GaN-based epitaxial layer, wherein the p-type reflector comprises:
   a whisker crystal of un-doped GaN, formed on a surface of the p-type GaN-based epitaxial layer with a predefined density distribution and at, a position that corresponds to a dislocation defect of the epitaxial structure; and
   a metal reflective layer, formed on both the p-type GaN-based epitaxial layer and the whisker crystal.

4. The GaN-based light-emitting device according to, claim 3, wherein the metal reflective layer comprises Ag, an Ag alloy, or a combination thereof.

* * * * *